(12) United States Patent
Wang

(10) Patent No.: US 10,763,620 B2
(45) Date of Patent: Sep. 1, 2020

(54) CIRCUIT SUBSTRATE

(71) Applicant: EmCom Technology Inc., Taipei (TW)

(72) Inventor: Chu-Li Wang, Taipei (TW)

(73) Assignee: EMCOM TECHNOLOGY INC., Taipei (TW)

( * ) Notice: Subject to any disclaimer, the term of this patent is extended or adjusted under 35 U.S.C. 154(b) by 0 days.

(21) Appl. No.: 16/257,812

(22) Filed: Jan. 25, 2019

(65) Prior Publication Data

US 2019/0229468 A1 Jul. 25, 2019

(30) Foreign Application Priority Data

Jan. 25, 2018 (TW) .............................. 107102733 A

(51) Int. Cl.
*H01R 24/00* (2011.01)
*H01R 13/6466* (2011.01)
*H05K 1/16* (2006.01)
*H05K 1/02* (2006.01)
*H01R 13/6469* (2011.01)
*H01R 13/66* (2006.01)
*H01R 24/64* (2011.01)

(52) U.S. Cl.
CPC ..... *H01R 13/6466* (2013.01); *H01R 13/6469* (2013.01); *H05K 1/0213* (2013.01); *H05K 1/162* (2013.01); *H01R 13/6658* (2013.01); *H01R 24/64* (2013.01); *H05K 2201/10189* (2013.01)

(58) Field of Classification Search
CPC ............ H01R 13/6466; H01R 13/6469; H01R 13/6658; H01R 24/64; H05K 1/0213; H05K 1/162; H05K 2201/10189

USPC .......................................... 439/676
See application file for complete search history.

(56) References Cited

U.S. PATENT DOCUMENTS

| | | | | |
|---|---|---|---|---|
| 3,955,194 A | * | 5/1976 | Chua ....................... | G01S 7/032 342/114 |
| 4,803,315 A | * | 2/1989 | Kako ................... | H01H 13/702 200/5 A |
| 4,924,348 A | * | 5/1990 | Weber ...................... | G01D 5/24 361/280 |
| 5,326,284 A | * | 7/1994 | Bohbot ................ | H05K 1/0228 439/607.01 |
| 7,658,651 B2 | | 2/2010 | Pepe et al. | |
| 9,591,759 B2 | | 3/2017 | Wang | |
| 10,424,990 B2 | * | 9/2019 | Hattori .................... | F04B 35/04 |
| 2009/0009980 A1 | * | 1/2009 | Ward .................... | H02M 7/003 361/807 |

(Continued)

FOREIGN PATENT DOCUMENTS

CN 205354863 U 6/2016
CN 106170173 A 11/2016

*Primary Examiner* — Abdullah A Riyami
*Assistant Examiner* — Nelson R. Burgos-Guntin
(74) *Attorney, Agent, or Firm* — Muncy, Geissler, Olds & Lowe, P.C.

(57) ABSTRACT

The present invention discloses a circuit substrate, including a first signal end, a second signal end, a first circular capacitor structure, and a second circular capacitor structure. The first circular capacitor structure is electrically connected to the first signal end. The second circular capacitor structure is electrically connected to the second signal end. The first circular capacitor structure and the second circular capacitor structure are located in different planes of the circuit substrate.

5 Claims, 9 Drawing Sheets

(56) References Cited

U.S. PATENT DOCUMENTS

| | | | |
|---|---|---|---|
| 2009/0226012 A1* | 9/2009 | Izuchi | H04R 19/016 381/174 |
| 2014/0148057 A1* | 5/2014 | Patel | H01R 13/6466 439/620.22 |
| 2014/0306793 A1* | 10/2014 | Shamim | H01F 17/0006 336/200 |
| 2015/0214666 A1* | 7/2015 | Schumacher | H01R 13/6477 439/676 |
| 2015/0340933 A1* | 11/2015 | Hattori | H02M 7/003 310/71 |
| 2016/0036166 A1* | 2/2016 | Hashim | H01R 13/6466 439/676 |
| 2019/0229468 A1* | 7/2019 | Wang | H01R 13/6466 |

* cited by examiner

| | | Square capacitor | | | | | Circular capacitor | | | |
|---|---|---|---|---|---|---|---|---|---|---|
| | Frequency (GHz) | Normal square capacitor (F) | Square capacitor (to which a tolerance is added) (F) | Quantity of capacitance value variations (F) | Variation quantity percentage | Frequency (GHz) | Normal circular capacitor (F) | Circular capacitor (to which a tolerance is added) (F) | Quantity of capacitance value variations (F) | Variation quantity percentage |
| Upper board and lower board having same sizes | 0.001 | 2.38E-14 | 2.49E-14 | 1.15E-15 | 4.84% | Positive tolerances are added to the upper board and lower board at the same time (a radius is 21.184 mil) | 0.001 | 2.90E-14 | 2.95E-14 | 5.80E-16 | 2.00% |
| | 0.1 | 2.38E-14 | 2.49E-14 | 1.14E-15 | 4.80% | | 0.1 | 2.89E-14 | 2.95E-14 | 5.90E-16 | 2.04% |
| | 0.5 | 2.38E-14 | 2.49E-14 | 1.14E-15 | 4.80% | | 0.5 | 2.89E-14 | 2.95E-14 | 6.00E-16 | 2.07% |
| | 2 | 2.38E-14 | 2.49E-14 | 1.15E-15 | 4.84% | | 2 | 2.89E-14 | 2.95E-14 | 5.80E-16 | 2.00% |
| | 0.001 | 2.38E-14 | 2.18E-14 | 1.94E-15 | 8.16% | Negative tolerances are added to the upper board and lower board at the same time (a radius is 20.184 mil) | 0.001 | 2.90E-14 | 2.74E-14 | 1.52E-15 | 6.39% |
| | 0.1 | 2.38E-14 | 2.18E-14 | 1.94E-15 | 8.16% | | 0.1 | 2.89E-14 | 2.74E-14 | 1.50E-15 | 6.31% |
| | 0.5 | 2.38E-14 | 2.18E-14 | 1.94E-15 | 8.16% | | 0.5 | 2.89E-14 | 2.74E-14 | 1.50E-15 | 6.31% |
| | 2 | 2.38E-14 | 2.18E-14 | 1.93E-15 | 8.12% | | 2 | 2.89E-14 | 2.74E-14 | 1.52E-15 | 6.40% |

Positive tolerances are added to the upper board and lower board at the same time (a length is 43 mil, and a width is 33 mil)

Negative tolerances are added to the upper board and lower board at the same time (a length is 41 mil, and a width is 31 mil)

FIG. 5A

CIRCUIT SUBSTRATE

BACKGROUND

Technical Field

The present invention relates to a circuit substrate, and in particular to a circuit substrate having a circular capacitor board.

Related Art

Generally, a high-frequency signal is transmitted by using a connection line and a connector, and signal crosstalk that is generated is reduced by performing capacitive coupling on a circuit substrate.

Conventionally, most of capacitive elements of circuit substrates used by sockets of connectors are formed of square plate capacitors (for example, U.S. Pat. No. 7,658,651).

However, an error is unavoidable in a circuit substrate manufacturing process, causing variations to a capacitance value.

As shown in FIG. 1A to FIG. 1C, FIG. 1A shows a normal capacitance simulation value of a conventional square capacitor whose upper and lower boards have same areas (where that the length is 42 mil, the width is 32 mil, and a vertical distance between the upper and lower boards is 0.02 mm is used as an example). FIG. 1B shows a simulation value (where the length is 41 mil and the width is 31 mil) obtained by adding a negative tolerance to the square capacitor shown in FIG. 1A. FIG. 1C is a simulation value (where the length is 43 mil and the width is 33 mil) obtained by adding a positive tolerance to the square capacitor shown in FIG. 1A.

SUMMARY

In view of this, an objective of the present invention is to provide a circuit substrate, to reduce, by using a structure of an upper circular capacitor board and a lower circular capacitor board, a capacitance value variation caused by a process error.

The circuit substrate includes a first signal end, a second signal end, a first circular capacitor structure, and a second circular capacitor structure. The first circular capacitor structure is electrically connected to the first signal end. The second circular capacitor structure is electrically connected to the second signal end.

The first circular capacitor structure and the second circular capacitor structure are located in different planes of the circuit substrate.

BRIEF DESCRIPTION OF THE DRAWINGS

FIG. 5A is a simulation diagram of a capacitance value of a conventional square capacitor and that of a circuit substrate of the present invention;

DETAILED DESCRIPTION

The following describes a plurality of implementations of the present invention with reference to the accompany drawings and words. For clarity, many practical details are described together in the following description. However, it should be understood that, the practical details should not be applied to limit the present invention. In addition, for simplicity, some known structures and elements are drawn in the accompanying drawings in simple and exemplary manners.

Figure 2A:
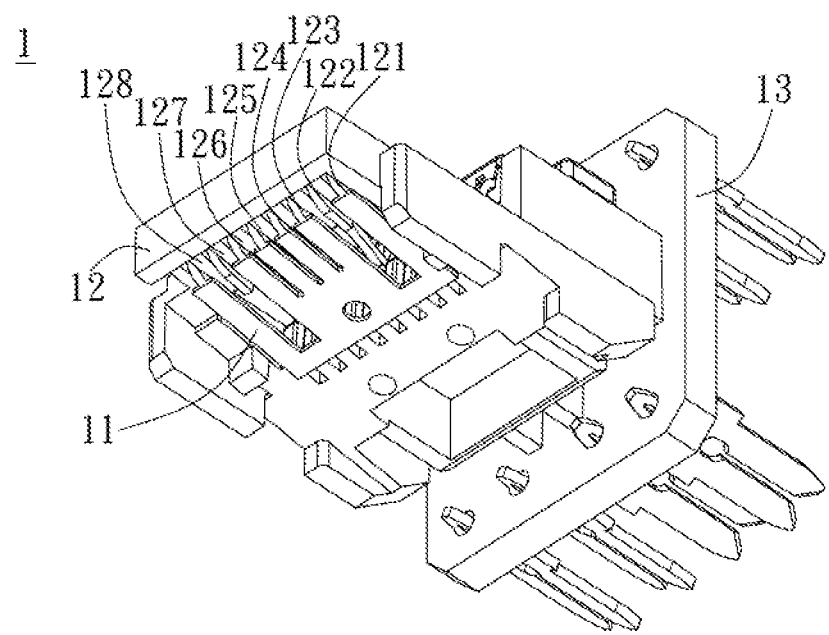
FIG. 2A is a three-dimensional diagram of an embodiment of a circuit substrate applicable to an electrical connector according to the present invention.
Figure 2B:
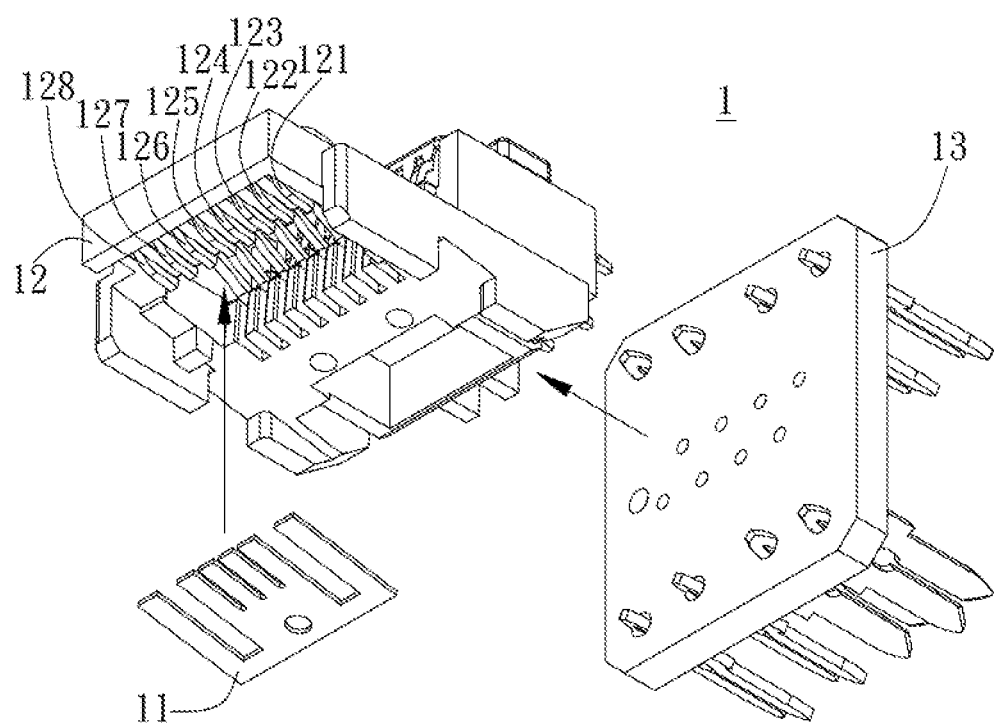
FIG. 2B is an exploded view of the embodiment in FIG. 2A.

Referring to FIG. 2A and FIG. 2B, a circuit substrate 11 in this embodiment is applicable to an electrical connector 1, for example, an electrical connector and a communication connector. This is not specially limited. The electrical connector 1 includes the circuit substrate 11, a mating portion 12, and a circuit board 13. Both the circuit substrate 11 and the circuit board 13 are electrically connected to metal contacts 121 to 128 on the mating portion 12.

Figure 3:
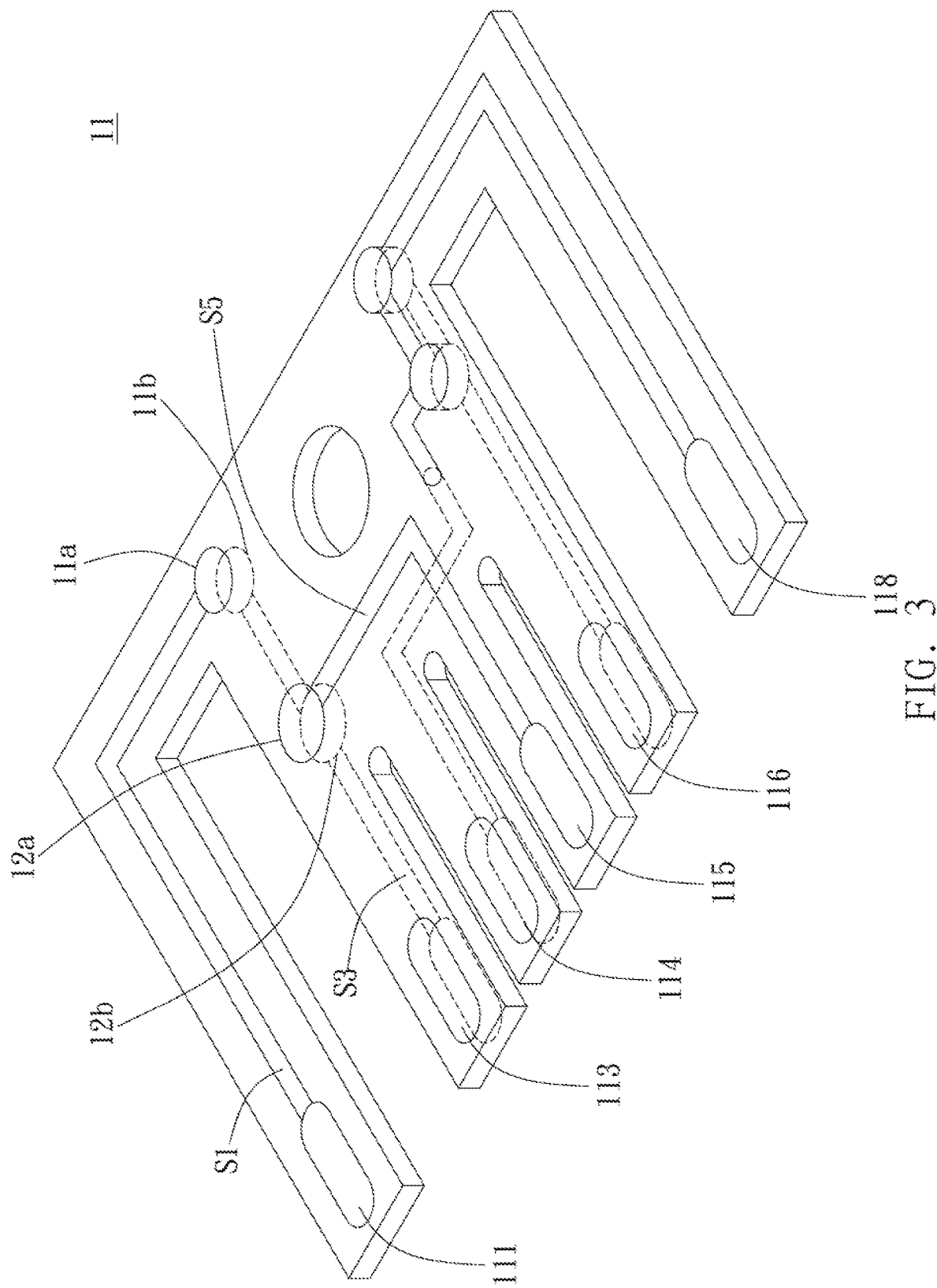
FIG. 3 is a three-dimensional diagram of an embodiment of a circuit substrate according to the present invention.

Referring to FIG. 3 and FIG. 4A to FIG. 4D. That the circuit substrate 11 in this embodiment is a flexible circuit board is used as an example, but this is not limited thereto. As shown in FIG. 2 to FIG. 3, the circuit substrate 11 preferably includes signal ends 111, 113, 114, 115, 116 and 118, a first circular capacitor structure 11a, and a second circular capacitor structure 11b. The signal ends 111, 113, 114, 115, 116 and 118 are respectively electrically connected to the metal contacts 121 to 128 on the mating portion 12. For example, the first signal end 111 is connected to the metal contact 121, the second signal end 113 is connected to the metal contact 123, and so on.

The first circular capacitor structure 11a is located at an upper layer of the circuit substrate 11, and is electrically connected to the first signal end 111 by using a signal line S1. The second circular capacitor structure 11b is preferably located at a layer different from the layer at which the first circular capacitor structure 11a is located, for example, the second circular capacitor structure 11b is located at a bottom layer, and is electrically connected to the second signal end 113 by using a signal line S3. Based on this design, an electric field may be stored by using the two circular capacitor structures: the upper circular capacitor structure 11a and the lower circular capacitor structure 11b, to further form capacitive coupling.

In this embodiment, that the areas of the first circular capacitor structure 11a and the second circular capacitor structure 11b are the same is used as an example, but this is not limited thereto. However, for ease of recognition, the two circular capacitor structures in the figure are still presented in different sizes.

Figure 1A:
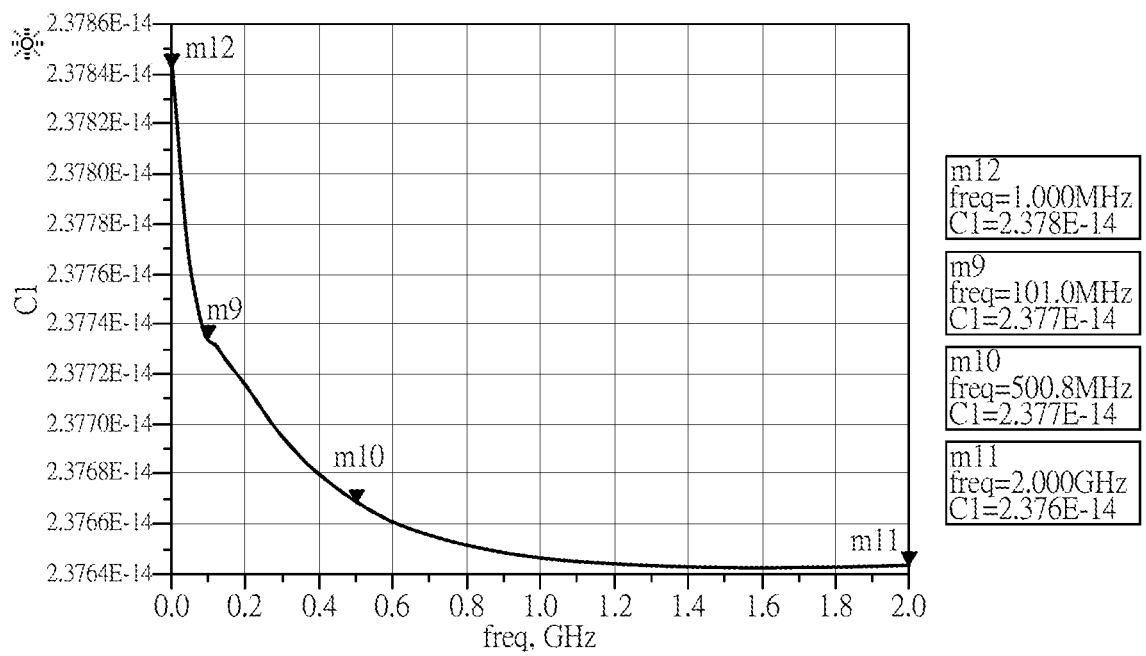
FIG. 1A to FIG. 1C are curved charts of capacitance value variations of a conventional square capacitor.
Figure 1B:
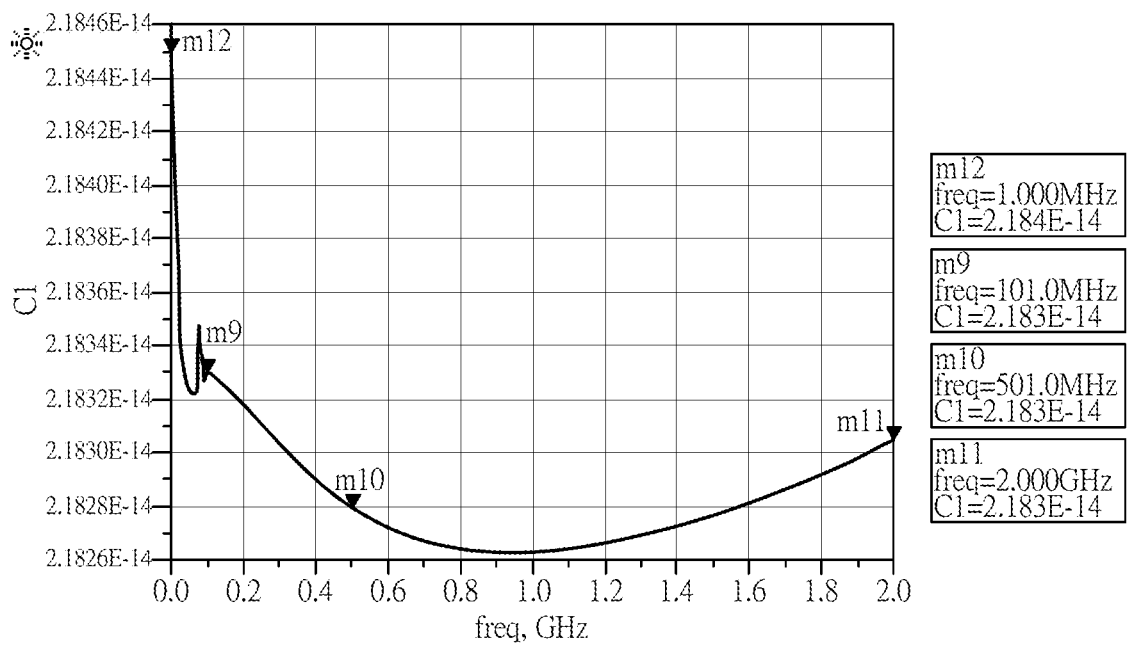
Figure 1C:
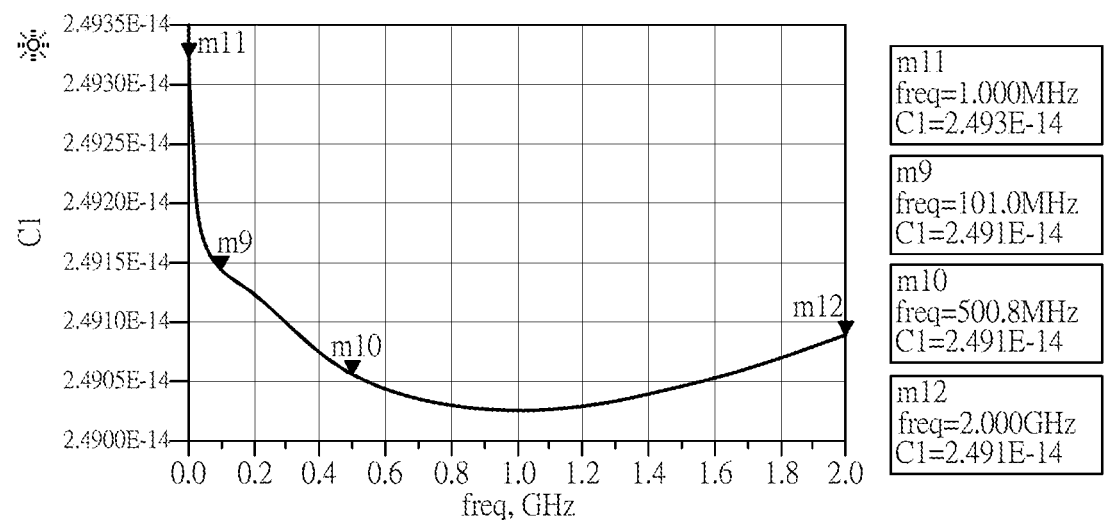
Figure 4A:
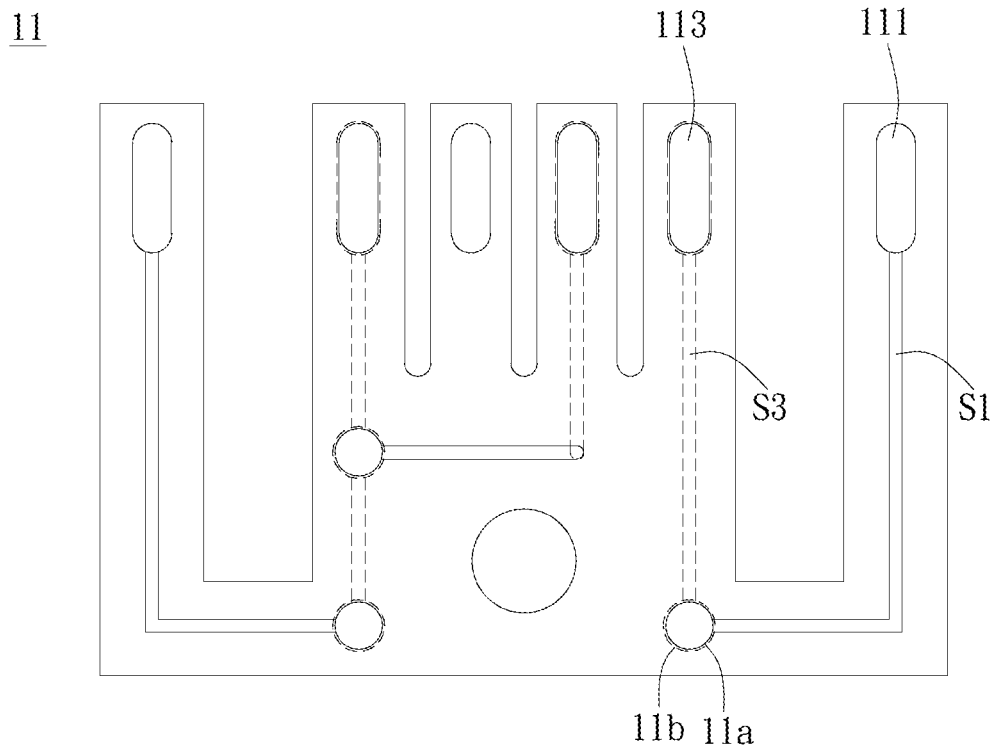
FIG. 4A is a schematic diagram of an embodiment of a circuit substrate according to the present invention.
Figure 4B:
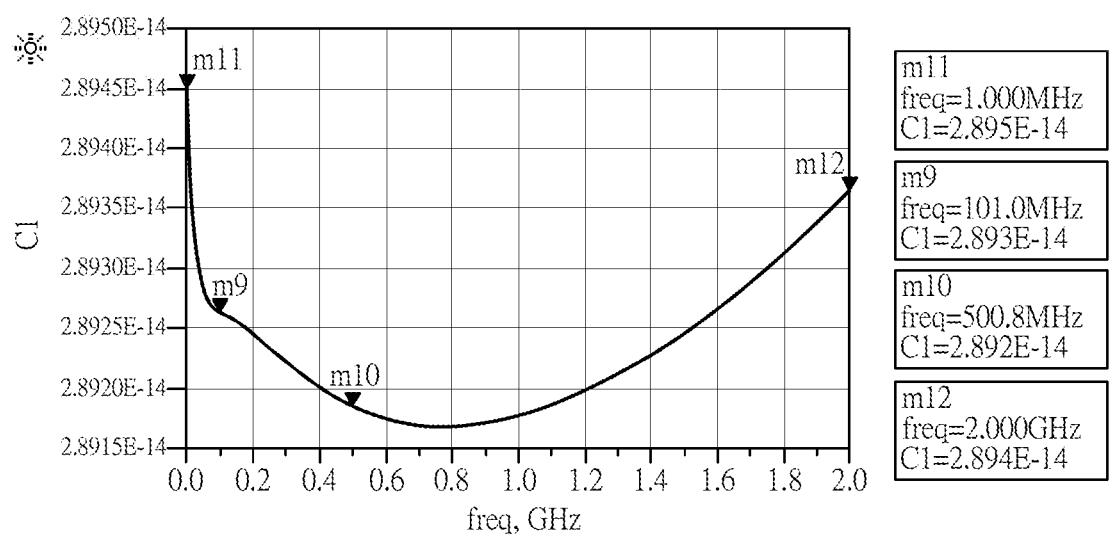
FIG. 4B to FIG. 4D are simulation diagrams of the embodiment in FIG. 4A.
Figure 4C:
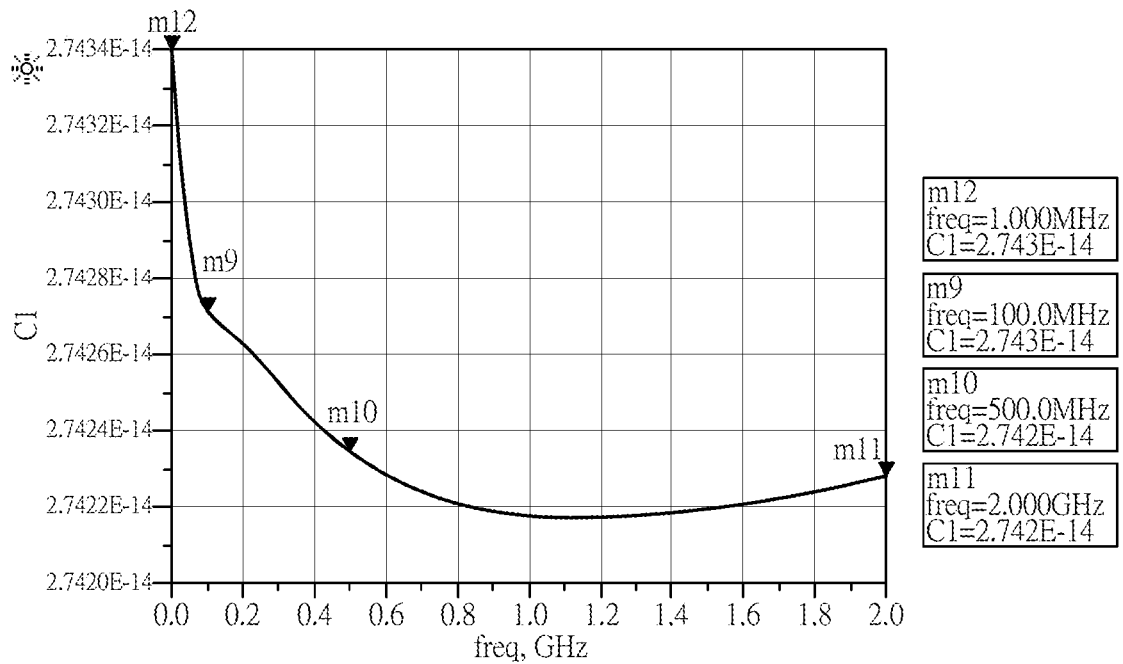
Figure 4D:
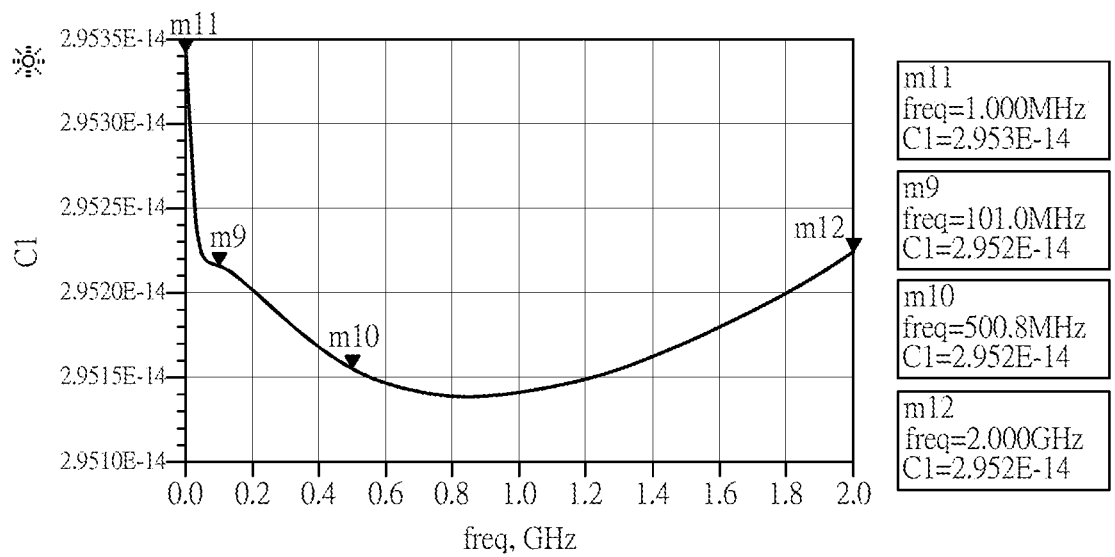

Referring to FIG. 4B to FIG. 4D, in this embodiment, the radii of both the first circular capacitor structure 11a and the second circular capacitor structure 11b are 20.684 mil (which is learned through conversion of the area of the square capacitor in FIG. 1A), and a vertical distance between the two capacitor boards is also 0.02 mm. When simulation is performed based on this condition, the capacitance values of the circuit substrate are approximately $2.895E^{-14}$ F, $2.893E^{-14}$ F, $2.892E^{-14}$ F, and $2.891E^{-14}$ F at different frequencies.

As shown in FIG. 4C and FIG. 4D, FIG. 4C and FIG. 4D are simulation data respectively obtained by adding a negative tolerance and a positive tolerance on the circular capacitor in FIG. 4B (where radii are respectively 20.184 mil and 21.184 mil).

In an embodiment, the circuit substrate may alternatively include a plurality of circular capacitor structures, for example, a third circular capacitor structure 12a and a fourth circular capacitor structure 12b. A third signal end 115 is electrically connected to the third circular capacitor structure 12a by using a signal line S5. The fourth circular capacitor structure 12b is electrically connected to the second signal end 113 by sharing the signal line S3, and the fourth circular capacitor structure 12b is capacitively coupled to the third circular capacitor structure 12a. In this embodiment, that the areas of the two circular capacitor structures are the same is also used as an example.

Figure 5B:
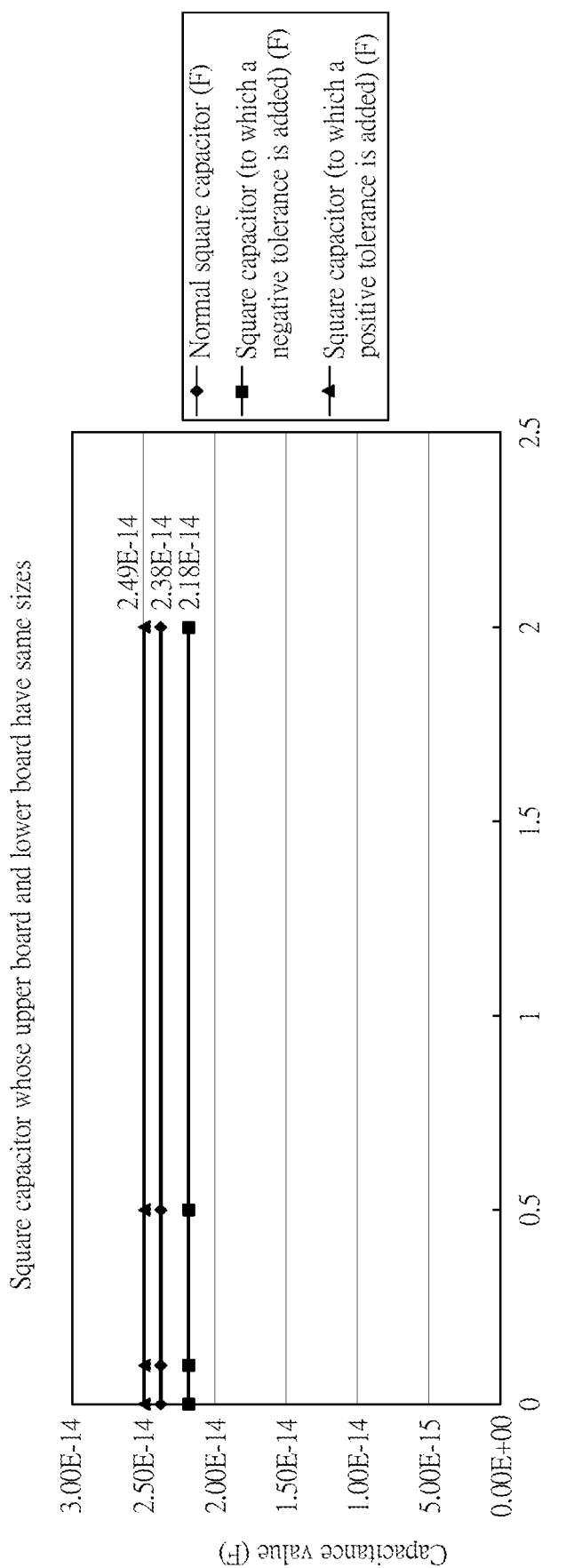
FIG. 5B is a simulation diagram of a conventional square capacitor to which a positive/negative tolerance is added.
Figure 5C:
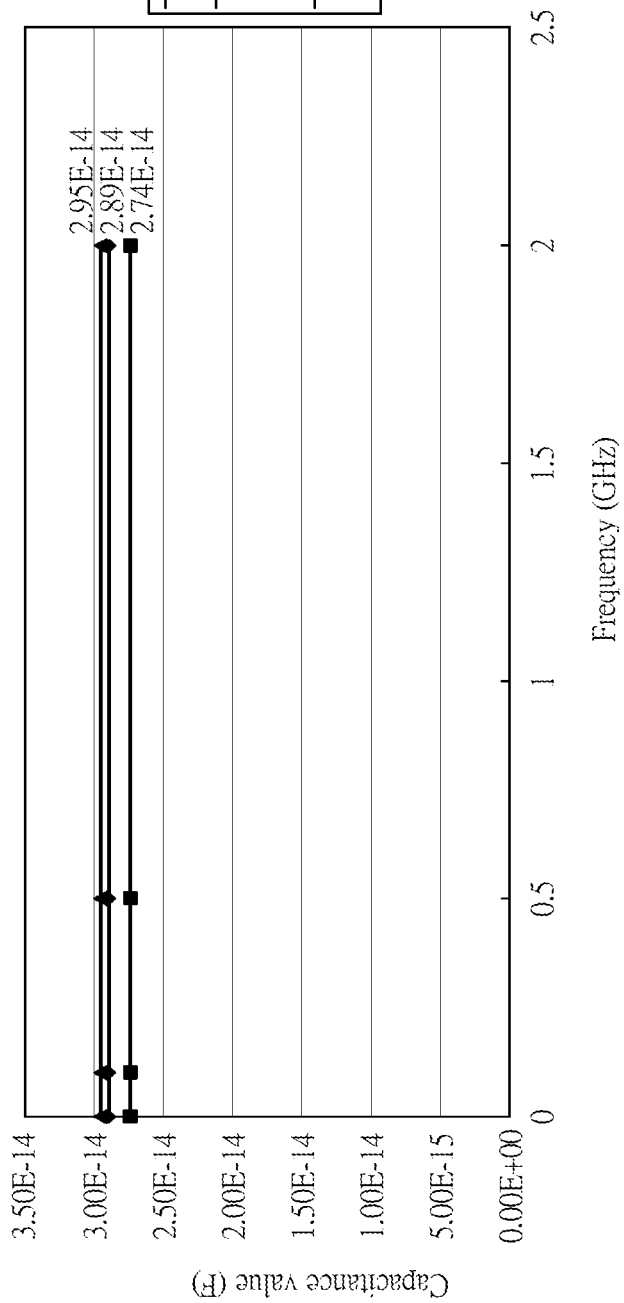
FIG. 5C is a simulation diagram of circuit substrate of the present invention to which a positive/negative tolerance is added.

Based on the foregoing embodiments and referring to FIG. 5A to FIG. 5C, FIG. 5A and FIG. 5B are statistical graphics of simulation capacitance values of a conventional normal square capacitance value and that when a process error occurs. As shown in the figure, by using a conventional square capacitor board as an example (where the areas are the same and a positive tolerance and a negative tolerance are respectively added), capacitance value errors obtained at different frequencies approximately fall between 4.84% and 8.16%.

FIG. 5A also includes a statistical graphic of simulation capacitance values of a normal circular capacitance value and that when a process error occurs according to the present invention. As shown in FIG. 5A and FIG. 5C, by using a circular capacitor board in the present invention as an example (where the areas are the same and a positive tolerance and a negative tolerance are respectively added), capacitance value errors obtained at different frequencies approximately fall between 2.00% and 6.40%.

In conclusion, it can be clearly learned through comparison that the circular capacitor structure of the present invention can effectively reduce a quantity of capacitance value variations caused by positive and negative tolerance of the process. That is, the circular plate capacitor structure has a relatively good efficacy of anti-process error.

The areas of the circuit substrate and the upper and lower boards of the circular capacitor structure of the present invention may be the same or may be different. This is not specifically limited, as described herein.

The circuit substrate of the present invention may also be a hard circuit board, a double-layer board, and a multi-layer board. This is not specifically limited, as described herein.

Compared with the conventional art, the circuit substrate of the present invention reduces, by using a structure of an upper circular capacitor board and a lower circular capacitor board, a capacitance value variation caused by a process error.

LIST OF REFERENCE NUMERALS

| 1 | Electrical connector | 11 | Circuit substrate |
|---|---|---|---|
| 12 | Mating portion | 13 | Circuit board |
| 111 | First signal end | 113 | Second signal end |
| 114 | Signal end | 115 | Third signal end |
| 116 | Signal end | 118 | Signal end |
| 121 | Metal contact | 122 | Metal contact |
| 123 | Metal contact | 124 | Metal contact |
| 125 | Metal contact | 126 | Metal contact |
| 127 | Metal contact | 128 | Metal contact |
| 11a | First circular capacitor structure | 11b | Second circular capacitor structure |
| 12a | Third circular capacitor structure | 12b | Fourth circular capacitor structure |
| S1 | Signal line | S3 | Signal line |
| S5 | Signal line | | |

What is claimed is:

1. A circuit substrate capable of reducing a quantity of capacitance value variations caused by positive and negative tolerance of processes, comprising:
   a first signal end;
   a second signal end;
   a first circular capacitor structure, electrically connected to the first signal end; and
   a second circular capacitor structure, overlapped with the first circular capacitor structure and electrically connected to the second signal end, wherein
   the first circular capacitor structure and the second circular capacitor structure are located in different planes of the circuit substrate.

2. The circuit substrate according to claim 1, wherein the areas of the first circular capacitor structure and the second circular capacitor structure are the same.

3. The circuit substrate according to claim 1, wherein the areas of the first circular capacitor structure and the second circular capacitor structure are not the same.

4. The circuit substrate according to claim 1, further comprising:
   a third signal end;
   a third circular capacitor structure, electrically connected to the third signal end; and
   a fourth circular capacitor structure, electrically connected to the second signal end, wherein
   the third circular capacitor structure and the fourth circular capacitor structure are located in different planes of the circuit substrate.

5. The circuit substrate according to claim 4, wherein the areas of the third circular capacitor structure and the fourth circular capacitor structure are the same.

* * * * *